(12) United States Patent
Mishra et al.

(10) Patent No.: US 11,715,544 B2
(45) Date of Patent: Aug. 1, 2023

(54) SYSTEM AND METHOD FOR LOW POWER MEMORY TEST

(71) Applicant: TEXAS INSTRUMENTS INCORPORATED, Dallas, TX (US)

(72) Inventors: Nitesh Mishra, Kanpur (IN); Nikita Naresh, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/538,942

(22) Filed: Nov. 30, 2021

(65) Prior Publication Data

US 2022/0415423 A1 Dec. 29, 2022

(30) Foreign Application Priority Data

Jun. 23, 2021 (IN) .............................. 202141028206

(51) Int. Cl.
*G11C 29/20* (2006.01)
*G11C 29/36* (2006.01)
*G11C 29/46* (2006.01)
*H03K 19/173* (2006.01)
*G11C 29/12* (2006.01)

(52) U.S. Cl.
CPC .......... *G11C 29/36* (2013.01); *G11C 29/1201* (2013.01); *G11C 29/12015* (2013.01); *G11C 29/46* (2013.01); *H03K 19/1737* (2013.01)

(58) Field of Classification Search
CPC ................ G11C 29/36; G11C 29/1201; G11C 29/12015; G11C 29/46; H03K 19/1737
See application file for complete search history.

(56) References Cited

U.S. PATENT DOCUMENTS

| 6,996,032 B2 * | 2/2006 | Ganry | G01R 31/31725 |
| | | | 368/118 |
| 2005/0025190 A1 * | 2/2005 | Frisch | G01R 31/3187 |
| | | | 370/503 |

\* cited by examiner

*Primary Examiner* — Mohammed A Bashar
(74) *Attorney, Agent, or Firm* — Michael T. Gabrik; Frank D. Cimino

(57) ABSTRACT

An apparatus includes a first group of memory units and a second group of memory units coupled to a first data path and a second data path coupled to a controller, a first delay element on the first data path coupled to the second group of memory units and configured to send, from the controller to the second group of memory units, signals for write and read operations in a sequence of time cycles delayed by a time cycle with respect to the first group of memory units, and a second delay element on the second data path and coupled to the first group of memory units and configured to send, from the first group of memory units to the controller, test result signals delayed by a time cycle, the delayed test result signals having a matching delay to the delayed write and read operations.

20 Claims, 5 Drawing Sheets

SYSTEM AND METHOD FOR LOW POWER MEMORY TEST

CROSS-REFERENCE TO RELATED APPLICATIONS

The present application claims priority to India Provisional Patent Application No. 202141028206, which was filed Jun. 23, 2021, and is hereby incorporated herein by reference in its entirety.

BACKGROUND

An embedded system is a combination of a processor, memory and other hardware components that have dedicated functions, such as in a system on a chip (SoC), within a computer or an electronic device. Embedded systems can be based on microcontrollers or microprocessors with integrated memory and peripheral interfaces on a chip or an electronic circuit board. In such systems, an embedded memory stores information for real-time or fast processing in a computer or electronic hardware. Memory implemented as a semiconductor device can be volatile or non-volatile. Examples of non-volatile memory include flash memory, read-only memory (ROM) and programmable ROM (PROM). Examples of volatile memory include random access memory (RAM), dynamic RAM (DRAM), static RAM (SRAM) and fast cache memory. Both types of memory devices store data in the form of digital signals. A digital signal can be represented mathematically as one (1) or a zero (0).

SUMMARY

In accordance with at least one example of the description, an apparatus includes memory units arranged in parallel, coupled to a first data path and a second data path, and grouped in a first group of memory units and a second group of memory units, where the first data path and the second data path are adapted to be coupled to a built-in self-test (BIST) controller, a first delay element disposed on the first data path and coupled to the second group of memory units and having a first delay element output configured to send, from the BIST controller to the second group of memory units, signals for write and read operations in a sequence of time cycles delayed by a time cycle of the sequence of time cycles with respect to the first group of memory units, and a second delay element disposed on the second data path and coupled to the first group of memory units and having a second delay element output configured to send, from the first group of memory units to the BIST controller, test result signals delayed by a time cycle of the sequence of time cycles, the delayed test result signals having a matching delay to the delayed write and read operations.

In accordance with another example of the description, a method includes receiving, via a first data path from a controller, test signals for memory units in a sequence of time cycles regulated by a clock of the controller, the memory units grouped into a first group of memory units and a second group of memory units, delaying, by a first delay element on the first data path, the test signals for the second group of memory units by a time cycle of the sequence of time cycles with respect to the first group of memory units, providing, by the memory units, respective test result signals responsive to the test signal, delaying, by a second delay element on a second data path from the memory units to the controller, a portion of the test result signals provided by the first group of memory units by a time cycle of the sequence of time cycles with respect to the second group of memory units, and sending, via the second data path to the controller, the test result signals without a time delay among the memory units, where the test result signals are sent to the controller without a lag between the test result signals from the first group of memory units and the test result signals from the second group of memory units relative to the clock of the controller.

In accordance with another example of the description, a non-transient computer-readable medium storing program instructions that, when executed by a processor, cause the processor to provide test signals in a sequence of time cycles to a first group of memory units, delay the test signals with respect to the first group of memory units by a time cycle of the sequence of time cycles to form delayed test signals, provide the delayed test signals to a second group of memory units, perform write operations, at first time cycles of the sequence of time cycles, on the test signals to the first group of memory units and on the delayed test signals to the second group of memory units, perform read operations, at second time cycles next to the first time cycles in the sequence of time cycles, to provide respective signals from the first group of memory units and the second group of memory units, provide test result signals from the first group of memory units and the second group of memory units based on the test signals, the delayed test signals and the respective signals, delay the test result signals from the first group of memory units by a time cycle of the sequence of time cycles with respect to the second group of memory units, and provide, from the first group and the second group of memory units, the test result signals at same time cycles of the sequence of time cycles without a time delay among the memory units.

BRIEF DESCRIPTION OF THE DRAWINGS

For a detailed description of various examples, reference will now be made to the accompanying drawings in which.

DETAILED DESCRIPTION

Figure 1:
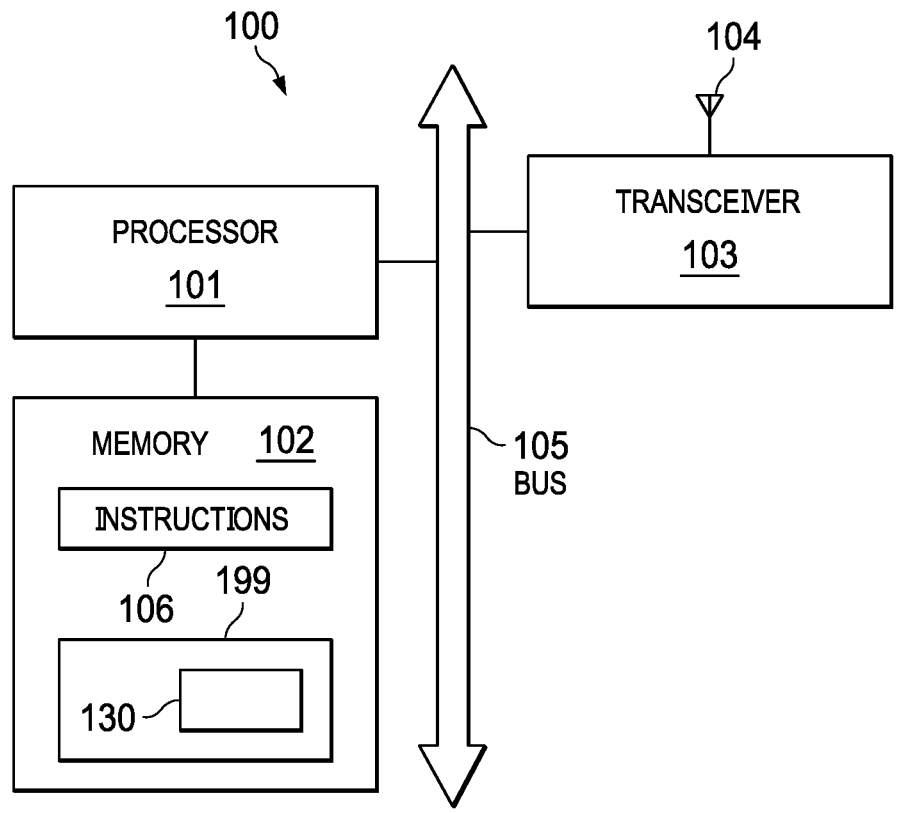
FIG. 1 is a block diagram of a hardware architecture for processing signal data, in accordance with various examples.

Memory embedded systems are tested to verify their proper operation and to detect possible damage. For example, an embedded memory in a system on a chip (SoC) is tested during manufacturing to detect possible defects. A memory on a chip can also be tested by a BIST controller, such as at boot up of a system including the memory. To reduce the startup time, the BIST controller may perform testing in parallel on a group of memory units, such as a group of random access memories (RAMs). Testing such components includes writing data to, and then reading data from, each memory unit in the group. The write and read operations are repeated in a sequence of time cycles, which may be regulated by a BIST controller clock, for each of the memory units in parallel. Each write and read operation may require an amount of power. Thus, a large amount of power available in the system (e.g., a power budget of the system) is consumed in simultaneously testing the number of memory units involved. Accordingly, the tested components may be subject to an abrupt increase in voltage levels during testing, which can result in heating of the components, which may lead to system damage. The power consumed in testing memory units in parallel may be limited to increase system safety and mitigate damage to the components resulting from the increased voltage levels. This may restrict or decrease a number of memory units that can be tested in parallel (e.g., simultaneously or concurrently) within the power budget.

The description presents a memory data path (MDP) architecture in which multiple memory units can be tested in parallel. Testing the memory units in a parallel manner according to the described MDP architecture may consume a reduced amount of power in comparison to parallel testing without the described MDP architecture. The reduced power consumption may allow for testing more memory units in parallel within a power budget provided for testing. Consequently, the overall amount of time for testing the entirety of memory units to be tested in the system can be reduced in comparison to parallel testing the memory units without the described MDP architecture.

In an example, the parallel memory units subject to testing in the MDP architecture are grouped into a first group and a second group. Each of the first group and second group may include half of the number of memory units subject to testing. The memory units in the first group may receive, in parallel to one another, write and read operations on a first data path from the BIST controller. The memory units in the second group may also receive, in parallel to one another, on the first data path from the BIST controller, write and read operations that are delayed by one time cycle with respect to the memory units in the first group. The first data path may be a first data path for sending signals from the BIST controller to the memory units. A second data path may be for sending signals from the memory units to the BIST controller. As such, at a given cycle, the memory units of one group are to perform a write operation while the memory units in the other group are to perform a read operation. Because the power consumption of a write operation may be higher (e.g., requires a higher current) than that of a read operation, the total amount of power consumed for testing all memory units to be tested per time cycle is reduced, resulting in a reduction in the overall power consumption for testing.

The test result signals from the memory units in the first group are also delayed by one time cycle to match the already delayed sequence of test result signals from the memory units in the second group. Subsequently, the sequence of test result signals from the memory units of both groups is sent on the second data path to the BIST controller without a delay among the memory units in both groups. Thus, the parallel memory test architecture may be backward compatible with existing BIST controllers and first and second data paths. The sequence of write and read operations can be delayed via pipelines on the data paths to introduce the time cycle delay to the respective group of memory units. The pipelines may include one or more elements such as a buffer, a register, a latch, a signal processing element or any combination thereof. The examples provided in the description include delaying the write and read operations at the second group of memory units by one time cycle with respect to the first group memory units and delaying the test result signals from the first group of memory units by one time cycle with respect to the second group of memory units. However, the steps and architectures in the examples can also be extended to delaying the write and read operations by any suitable time delay, such as one or more time cycles, and accordingly delaying the test signals by a matching time delay.

FIG. 1 is a block diagram of a hardware architecture 100 of a processing system useful for processing signal data, in accordance with various examples. The hardware architecture 100 includes hardware components that may be part of the processing system. In an example, the hardware architecture 100 may be part of an automotive system that provides signal processing and control. As shown in FIG. 1, the hardware architecture 100 may include one or more processors 101 and one or more memories 102. In some examples, the hardware architecture 100 may also include one or more transceivers 103 and one or more antennas 104 for establishing wireless connections. These components may be connected through a bus 105, or in any other suitable manner. In FIG. 1, an example in which the components are connected through a bus 105 is shown.

The processor 101 may be configured to read and execute computer-readable instructions. For example, the processor 101 may be configured to invoke and execute instructions stored in the memory 102, including the instructions 106. The processor 101 may support one or more global systems for communication. Responsive to the processor 101 sending a message or data, the processor 101 drives or controls the transceiver 103 to perform the sending. The processor 101 also drives or controls the transceiver 103 to perform receiving, responsive to the processor 101 receiving a message or data. Therefore, the processor 101 may be considered as a control center for performing sending or receiving and the transceiver 103 is an executor for performing the sending and receiving operations.

In some examples, the memory 102 may be coupled to the processor 101 through the bus 105. In other examples, the memory 102 may be integrated with the processor 101. The memory 102 is configured to store various software programs and/or multiple groups of instructions, including instructions 106. For example, the memory 102 may include a high-speed random-access memory and/or may include a nonvolatile memory such as one or more disk storage devices, a flash memory or another nonvolatile solid-state storage device. The memory 102 may store an operating system such as ANDROID, IOS, WINDOWS or LINUX. The memory 102 may further store a network communications program. The network communications program is useful for communication with one or more attached devices, one or more user equipments or one or more network devices, for example. The memory 102 may further store a user interface program. The user interface program may display content of an application through a graphical interface and receive a control operation performed by a user on the application via an input control such as a menu, a dialog box or a physical input device (not shown). The memory 102 may be configured to store the instructions 106 for implementing the various methods and processes provided in accordance with the various examples of this description.

The antenna 104 may be configured to exchange wireless communications signals between the processing system and a network or another system or device. The transceiver 103 may be configured to transmit a signal that is provided by the processor 101 or may be configured to receive a wireless communications signal received by the antenna 104. In this example, the transceiver 103 may be considered a wireless transceiver.

The hardware architecture 100 may also include another communications component such as a Global Positioning System (GPS) module, a BLUETOOTH module or a WI-FI module. The hardware architecture 100 may also support another wireless communications signal such as a satellite signal or a short-wave signal. The hardware architecture 100 may also be provided with a wired network interface or a local area network (LAN) interface to support wired communication.

In various examples, the hardware architecture 100 may further include an input/output device (not shown) such as an audio input/output device, a key input device, a display and the like. The input/output device may be configured to implement interaction between the hardware architecture 100 and a user/an external environment and may include the audio input/output device, the key input device, the display and the like. The input/output device may further include a camera, a touchscreen, a sensor and the like. The input/output device may communicate with the processor 101 through a user interface.

The hardware architecture 100 shown in FIG. 1 is one example of implementation according to this description. Other implementations of the hardware architecture 100 may include more or fewer components. The hardware architecture 100 may also include memory units 130 under test coupled to the processor 101. The memory units 130 may be interconnected in an MDP architecture 199, which may be part of the memory 102 or may be integrated with the processor 101. The memory units 130 may be read and write enabled memory components configured to read data received in signals in the MDP architecture 199, and write the data locally in memory registers of the memory units 130. Examples of the memory units 130 may include RAMs, DRAMs, SRAMs, fast cache memory or any combination thereof. The signals in the MDP architecture 199 may be digital signals and at least some of the components of the MDP architecture 199 may be implemented via digital circuits. In various examples, the components of the MDP architecture 199 may include analog circuit components, digital circuit components or combinations thereof.

Figure 2A:
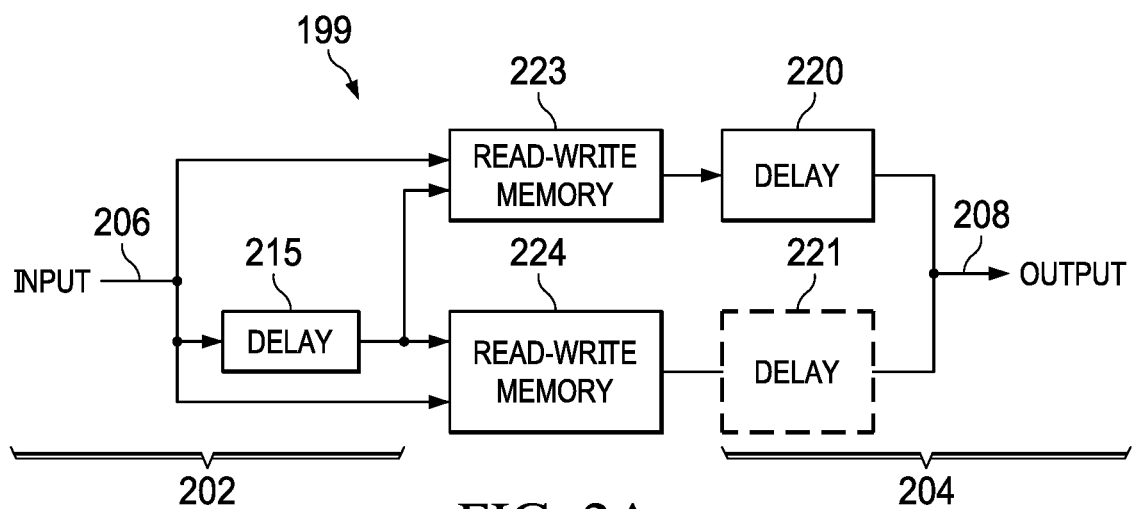
FIG. 2A is a circuit diagram of a memory data path (MDP) architecture, in accordance with various examples.

FIG. 2A shows a block diagram of the MDP architecture 199, in accordance with various examples. For example, the MDP architecture 199 may be a component of the hardware architecture 100 and/or the memory 102. The MDP architecture 199 may be coupled to or may be integrated with the processor 101. The MDP architecture 199 includes multiple memory units 130 under test, which are grouped into a first group 223 and a second group 224 of memory units 130. The first group 223 and the second group 224 may include an equal number of memory units 130 to be tested. For example, each of the first group 223 and the second group 224 may include half the number of memory units 130 in the MDP architecture 199. In further examples, the memory units 130 under test are divided into any arbitrary number of groups.

The first group 223 and the second group 224 may be coupled to a BIST controller 225 through a first data path 202 and a second data path 204. The first data path 202 may have an input channel 206 and may forward signals (e.g., address signals, write data signals, memory control signals) from the BIST controller 225 through the input channel 206 to the memory units 130. The second data path 204 may have an output channel 208 and may forward signals (e.g., test result signals) from the memory units 130 through the output channel 208 to the BIST controller 225. The MDP architecture 199 may include a first delay element 215 coupled to the input channel 206 and to both the first group 223 and the second group 224, and a second delay element 220 coupled to the first group 223 and the output channel 208. The first delay element 215 may be configured to either delay signals from the BIST controller 225 to the second group 224 with respect to the first group 223 or from the BIST controller 225 to the first group 223 with respect to the second group 224. The second delay element 220 may be configured to delay signals from the first group 223 to the BIST controller 255 with respect to the second group 224.

In some examples, the first delay element 215 may be selectably coupled to the first group 223 and the second group 224 so that signals to either the first group 223 or the second group 224 may be delayed, and the MDP architecture 199 may also include a third delay element 221 coupled to the second group 224 and the output channel 208. Accordingly, the first delay element 215 may be configured to delay the signals from the BIST controller 255 to one of the first group 223 or the second group 224. Responsive to delaying the signals from the BIST controller 255 to the first group 223, the third delay element 221 may be configured to delay the signals from the second group 224 to the BIST controller 255.

Figure 2B:
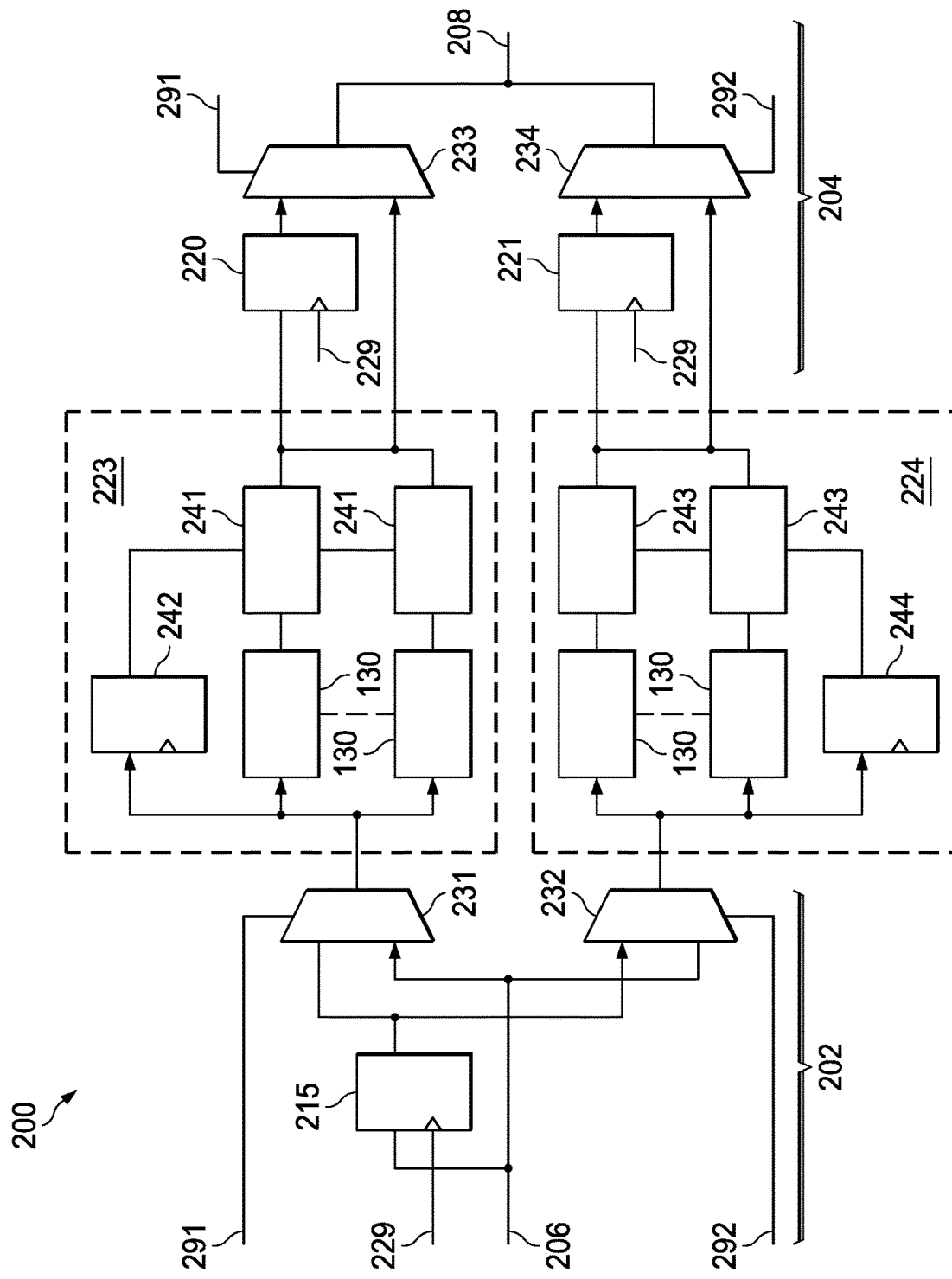
FIG. 2B is a circuit diagram showing components of the MDP architecture of FIG. 2A, in accordance with various examples.

FIG. 2B shows a block diagram of components of the MDP architecture 199, in accordance with various examples. The first delay element 215, the second delay element 220 and the third delay element 221 may be coupled to clock channel 229 for receiving a clock signal that regulates operation of the first, second and third delay elements 215, 220 and 221. The first data path 202 of the MDP architecture 199 may include a first multiplexer 231 coupled to the first delay element 215 and the first group 223, and a second multiplexer 232 coupled to the first delay element 215 and the second group 224. The second data path 204 may include a third multiplexer 233 coupled to the second delay element 220 and the output channel 208, and a fourth multiplexer 234 coupled to the third delay element 221 and the output channel 208. The first multiplexer 231 and the fourth multiplexer 234 may also be coupled to a first pipeline bypass channel 291. The second multiplexer 232 and the third multiplexer 233 may also be coupled to a second pipeline bypass channel 292. The first pipeline bypass channel 291 and the second pipeline bypass channel 292 may provide the first, second, third and fourth multiplexers 231, 232, 233 and 234 with respective pipeline bypass signals to control the signal flow in the MDP architecture 199, as described below. The pipeline bypass signals may be sent by the BIST controller 255 to the first and third multiplexers 231 and 233 through the respective first pipeline bypass channel 291, and to the second and fourth multiplexers 232 and 234 through the second pipeline bypass channel 292.

Figure 3:
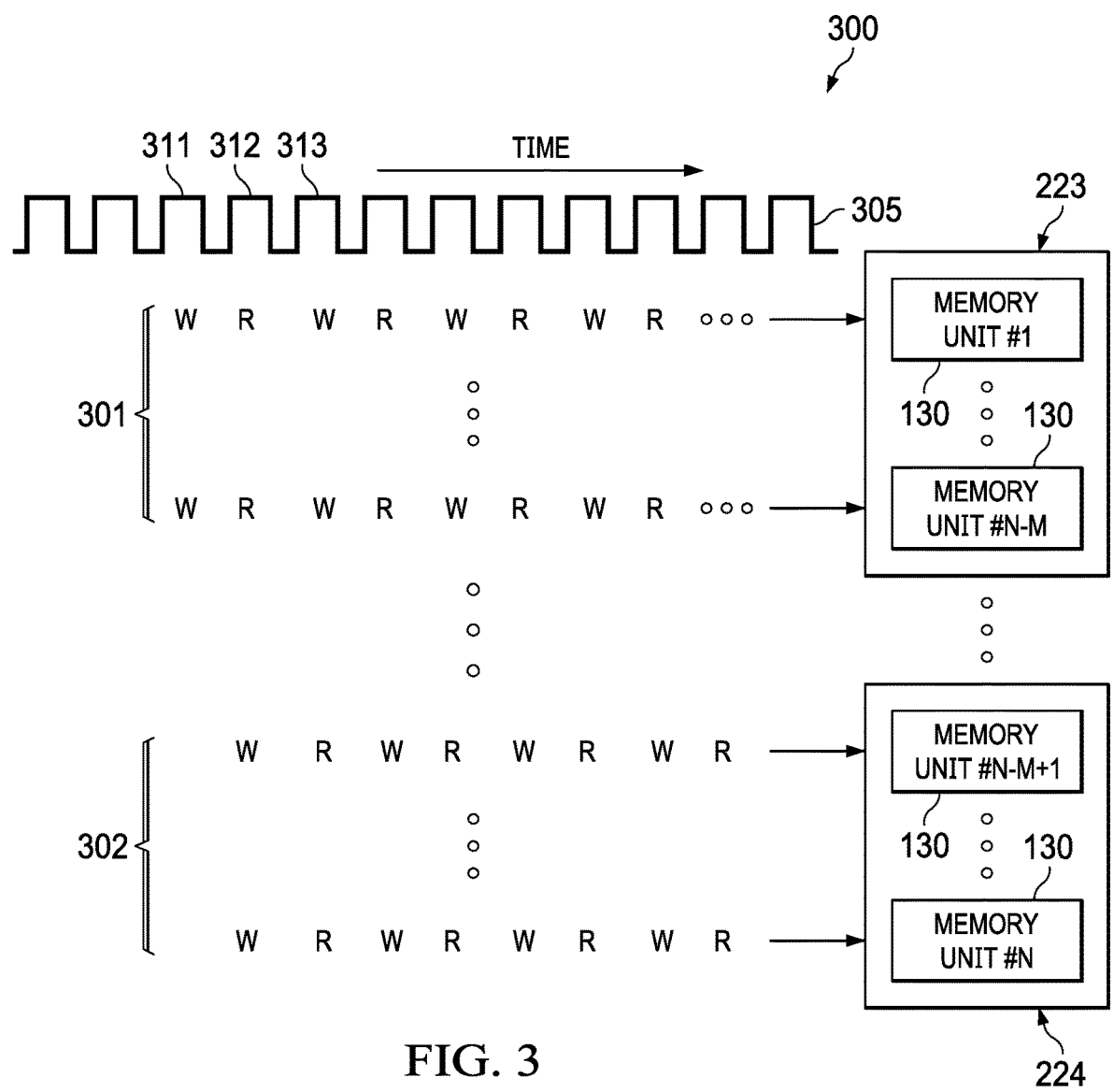
FIG. 3 is a diagram of a sequence of test signals in the MDP architecture of FIGS. 2A and 2B, in accordance with various examples.

The first group 223 may include first comparators 241 and a fourth delay element 242. Each first comparator 241 may be coupled to a respective memory unit 130 in the first group 223 and to the second delay element 220. The first comparators 241 may compare between write data signals from the BIST controller 225 and the data written in the respective memory units 130 in the first group 223 according to the write data signals. The first comparators 241 may provide output signals indicating whether the written data match the write data signals from the BIST controller 225. The fourth delay element 242 may be coupled, in parallel with the memory units 130 in the first group 223, to the first multiplexer 231 and the first comparators 241. The second group 224 may also include multiple second comparators 243 and a fifth delay element 244. Each second comparator 243 may be coupled to a respective memory unit 130 in the second group 224 and to the third delay element 221. The second comparators 243 may compare between write data signals from the BIST controller 225 and the data written in the respective memory units 130 in the second group 224 according to the write data signals, and provide output signals that indicate whether the written data match the write data signals. The fifth delay element 244 may be coupled, in parallel with the memory units 130 in the second group 224, to the second multiplexer 232 and the second comparators 243. FIG. 3 is a diagram of a sequence of test signals 300 in the MDP architecture 199, in accordance with various examples.

The signals 300 may be provided by the BIST controller 255 to a number N of memory units 130 under test in the MDP architecture 199. In examples, the N memory units 130 may be grouped into N/2 memory units 130 in the first group 223 and N/2 memory units 130 in the second group 224. In other examples, the first group 223 may include M memory units 130 and the second group 224 may include N-M memory units 130, where M is less than N and N and M are integers. The test signals 300 may include signals (e.g., address signals, write data signals, write enable signals, read enable signals, etc.) for triggering write and read operations at the memory units 130. The test signals 300 may be arranged in a sequence of equal time cycles of a clock signal 305 of the BIST controller 255. The test signals 300 may include instructions for consecutive write and read operations to be performed at the memory units 130, such that each write operation performed by a memory unit 130 in a time cycle is followed by a read operation by the same memory unit 130 in the next time cycle of the clock signal 305. The test signals 300 may be received from the BIST controller 255 through the input channel 206, and the clock signal 305 may be received through the clock channel 229.

The test signals 300 may be sent, in each time cycle of the clock signal 305, by the BIST controller 255 through the input channel 206 to the first multiplexer 231 and the second multiplexer 232. The BIST controller 255 may also provide a delayed version of the same test signals 300 through the input channel 206 to the first multiplexer 231 and the second multiplexer 232 via the first delay element 215. The first delay element 215 may delay the test signals 300 by one time cycle of the clock signal 305 and send the delayed test signals 300 to both the first multiplexer 231 and the second multiplexer 232.

Accordingly, the first multiplexer 231 may send first test signals 301 to the memory units 130 in the first group 223. Based on the pipeline bypass signal received on the first pipeline bypass channel 291, the first test signals 301 may be either undelayed test signals 300 received on the input channel 206 from the BIST controller 255 or delayed test signals 300 received from the first delay element 215. Similarly, the second multiplexer 232 may send second test signals 302 to the memory units 130 in the second group 224, according to the pipeline bypass signal received on the second pipeline bypass channel 292. The second test signals 302 sent to the memory units 130 in the second group 224 may be delayed test signals 300 received from the first delay element 215 if the first test signals 301 are undelayed test signals 300 sent to the memory units 130 in the first group 223. Alternatively, the second test signals 302 may be undelayed test signals 300 received from the BIST controller 255 if the first test signals 301 are delayed test signals 300. FIG. 3 shows an example where the first test signals 301 are undelayed test signals 300, and the second test signals 302 are delayed test signals 300 lagging the first test signals 301 by one time cycle of the clock signal 305. The first multiplexer 231 and the second multiplexer 232 may send the first test signals 301 and second test signals 302, respectively, for parallel processing to the memory units 130 in the first group 223 and the second group 224, respectively. Accordingly, the memory units 130 in the first group 223 may receive instructions to perform write operations (W) and read operations (R) delayed by the one-time cycle with respect to the memory units 130 in the second group 224. For example, in a certain time cycle of the clock signal 305, each of the memory units 130 in the first group 223 may perform a write operation (W) according to a respective first test signal 301, and each memory unit 130 in the second group 224 may perform a read operation (R) according to a respective second test signal 302. In a next time cycle, each of the memory units 130 in the first group 223 may perform a read operation (R), and each memory unit 130 in the second group 224 may perform a write operation (W) according to a respective second test signal 302

After writing data in a write operation according to write data signals of the test signals 301 and the second test signals 302 in the memory units 130 in a time cycle of the clock signal 305, the memory units 130 may read the written data in a read operation according to a read enable signal of the test signals 301 and the second test signals 302 at the next time cycle. At the same time cycle, the fourth and fifth delay elements 242 and 244 may retain the write data for a duration of one time cycle. As such, the memory units 130 may send the read data and the fourth and fifth delay elements 242 and 244 may send the retained written data at the same time cycle of the clock signal 305 to the respective first comparators 241 in the first group 223 and the second comparators 243 in the second group 224.

For example, at an initial first time cycle 311, the memory units 130 in the first group 223 may perform a write operation (W) by writing data, as indicated in the first test signals 301 at the first cycle 311, into respective local registers. The write data indicated in the first test signals 301 may also be retained by the fourth delay element 242 at the first time cycle 311. At a subsequent second time cycle 312, the memory units 130 in the first group 223 may perform a read operation (R), as indicated by a read enable signal in the first test signals 301 in the second time cycle 312, to read the previously written data in the first cycle 311. At the same second cycle 312, the memory units 130 in the second group 224 may perform a write operation (W) by writing data, as indicated in the delayed second test signals 302 at the second cycle 312, into respective local registers. The write data indicated in the second test signals 302 may also be retained by the fifth delay element 244 at the second time cycle 312. At a next third cycle 313, the data read by the first memory units 130 in the first group 223 may be compared by the respective first comparators 241 to the data retained at the fourth delay element 242. At the same third cycle 313, the memory units 130 in the first group 223 may perform a next write operation (W) by writing data, indicated in the first test signals 301 at the third cycle 313, into the respective local registers. At the same third cycle 313, the memory units 130 in the second group 224 may perform a read operation (R), as indicated by a read enable signal in the second test signals 302 in the third time cycle 313, to read the previously written data in the second cycle 311. The data read by the second memory units 130 in the second group 224 may be compared to the data retained at the fifth delay element 244 by the respective second comparators 243 in a next time cycle. The write and read operations may be repeated similarly in the next time cycles by the memory units 130 in the first group 223 and second group 224 according to the respective first test signals 301 and delayed second test signals 302. In each next time cycle, the first comparators 241 and second comparators 243 may also compare the data read, in the previous time cycle, by the first memory units 130 in the first group 223 and the second group 224 with the data retained, in the previous time cycle, at the fourth delay element 242 and fifth delay element 244, respectively.

The first and second comparators 241 and 243 may compare the read data and the retained written data and send respective test results in the form of test result signals from the first group 223 and second group 224 to the second delay element 220 and the third delay element 221, respectively. The test result signals may indicate any error in testing the memory units 130 responsive to any mismatch between the read data and the written data. For example, the test result signals may include pass and fail data for the memory units 130. The test result signals may be sent, in each time cycle of the clock signal 305, from the first comparators 241 to the second delay element 220 and from the second comparators 243 to the third delay element 221. The second delay element 220 or the third delay element 221 may introduce a time delay in the test result signals that matches the time delay introduced in the test signals 300 by the first delay element 215. The time delay introduced in the test result signals by the second delay element 220 or the third delay element 221 may compensate or adjust for the time delay introduced in the test signals 300 by the first delay element 215. Accordingly, the test result signals from the first group 223 may not be lagging the test result signals from the second group 224 relative to the clock signal 305 of the BIST controller 255.

For example, responsive to the first delay element 215 delaying the test signals 300 by one time cycle of the clock signal 305 for the second group 224 with respect to the first group 223, the second delay element 220 may delay the test result signals from the first group 223 by one time cycle with respect to the second group 224. In another example, responsive to the first delay element 215 delaying the test signals 300 for the first group 223 by one time cycle with respect to the second group 224, the third delay element 221 may delay the test result signals from the second group 224 by one time cycle with respect to the first group 223. Accordingly, the test result signals from the tested memory units 130 in both the first and second groups 223 and 224 may include test result signals of write and read operations initially received through the input channel 206 at the same time cycles of the clock signal 305 without a time delay among the memory units 130.

The time delays to the test signals 300 and the test result signals may be switched or blocked according to pipeline bypass signals provided by the first pipeline bypass channel 291 and the second pipeline bypass channel 292 to the first, second, third and fourth multiplexers 231, 232, 233 and 234. For example, to delay the test signals 300 by the first delay element 215 and delay the test result signals by the second delay element 220, a first enable pipeline bypass signal may be sent to the first multiplexer 231 or another component of the first data path 202 and to the third delay element 221 or another component of the second data path 204. To delay the test signals 300 by the first delay element 215 and delay the test result signals by the third delay element 221, a second enable pipeline bypass signal may be sent to the second multiplexer 232 or another component of the first data path 202 and to the second delay element 220 or another component of the second data path 204.

The test result signals of the first group 223 may be received by the third multiplexer 233 in parallel from the first comparators 241 and may be combined into a first output signal. The test result signals of the second group 224 may be received by the fourth multiplexer 234 in parallel from the second comparators 243 and may be combined into a second output signal. The first and second output signals may be combined into a test result output signal including a sequence of test result signals arranged in time in accordance with the clock cycles of the clock signal 305. The test result output signal may be sent through the output channel 208 to the BIST controller 255.

Figure 4A:
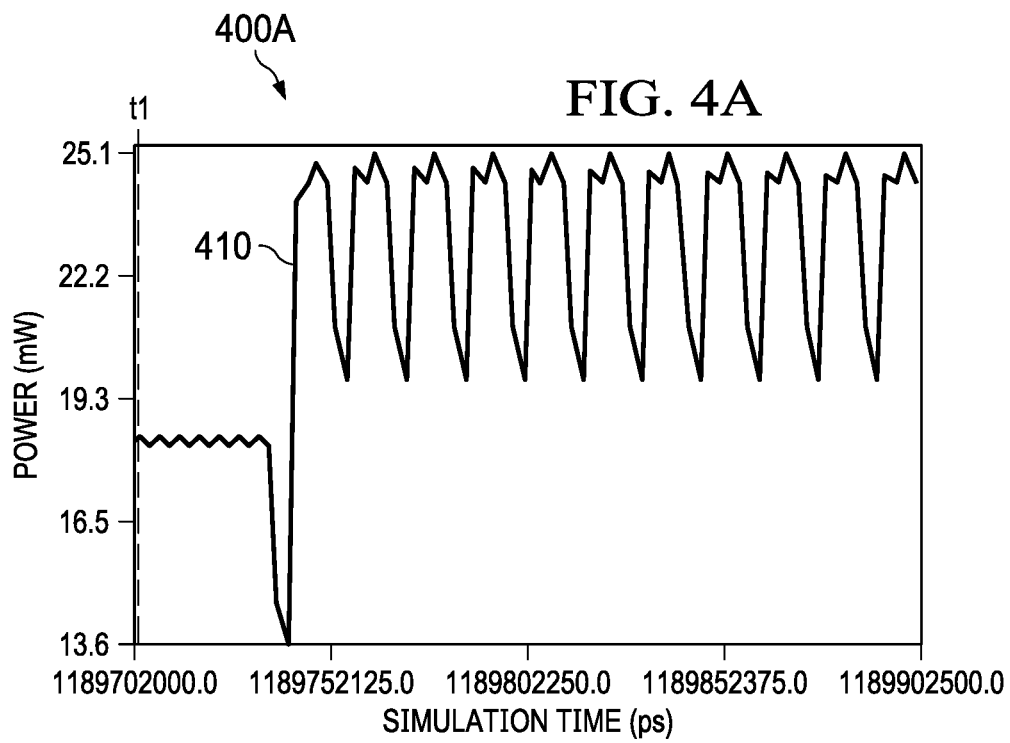
FIGS. 4A and 4B are graphs showing power consumption levels of the MDP architecture of FIGS. 2A and 2B, in accordance with various examples.
Figure 4B:
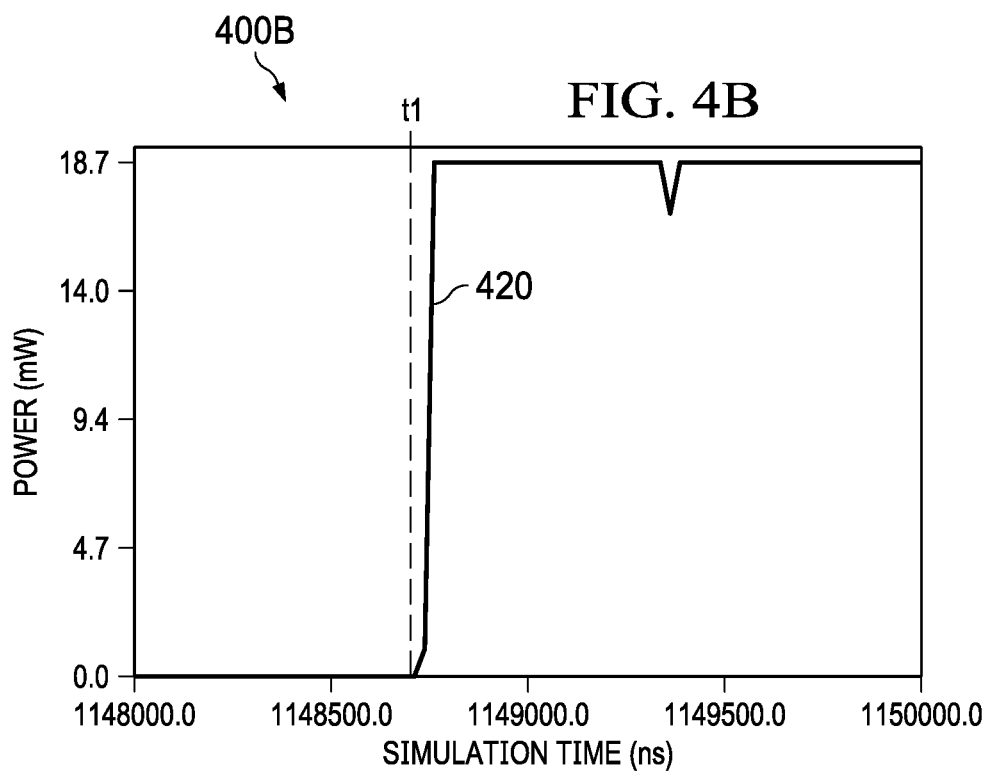

FIGS. 4A and 4B show power consumption levels of the MDP architecture 199 of FIGS. 2A and 2B, in accordance with various examples. FIG. 4A is a graph 400A showing power data that represents the amount of consumed power over a time range to perform operations in the MDP architecture 199, including the write and read operations of the memory units 130. The amount of consumed power is represented by a curve 410. In the graph 400A, the x-axis represents a range of time in picoseconds (ps) and the y-axis represents the power amount in milliwatts (mW). The curve 410 shows that at time t1, following the conclusion of an initial startup time, for operations, the power consumption reaches a peak of about 25.1 mW. For example, the peak value may be approximated by the equation $N/2*P(w)+N/2*P(r)$, where $P(w)$ and $P(r)$ are the power consumption amounts for the write and read operations, respectively, at a single memory unit 130 of the MDP architecture 199. The peak in the power consumption of the MDP architecture 199 shows a decrease of about 13 percent (%) in comparison to other MDP architectures that include parallel testing of the memory units without introducing time delays, as described herein, in the test signals of the memory units or groups of memory units.

FIG. 4B is a graph 400B showing startup time power data that represents the amount of power jump in the consumed power in the MDP architecture 199 at the start of the testing process. The power jump may be responsive to switching components of the MDP architecture 199 from an inactive state into an active or charged state. In the graph 400B, the x-axis represents a range of time in nanoseconds (ns) and the y-axis represents the power amount in mW. The power jump is represented by a curve 420 at the initial startup time for testing the memory units 130 by the BIST controller. At least a portion of the curve 420 may be part of the beginning portion of the curve 410, where the time range on the x-axis of FIG. 4B may precede the time range of the x-axis of FIG. 4A. The jump in power consumption at the startup time for testing the MDP architecture 199 shows a decrease of about 36% in comparison to other MDP architectures that do not include a time delay, as described herein, in the test signals among the memory units which are tested in parallel.

The power consumption and startup time power data of FIGS. 4A and 4B, respectively, show the power consumption reduction of the MDP architecture 199 over other architectures for testing read and write enabled memory units. The reduced power jump in power consumption at the startup time for testing may mitigate damage to components of the MDP architecture 199 due to the abrupt increase in voltage levels during testing. The reduced power consumption during testing operations after the startup time may allow the reduction of the power budget in the system or the reallocation of more power to other resources.

Figure 5:
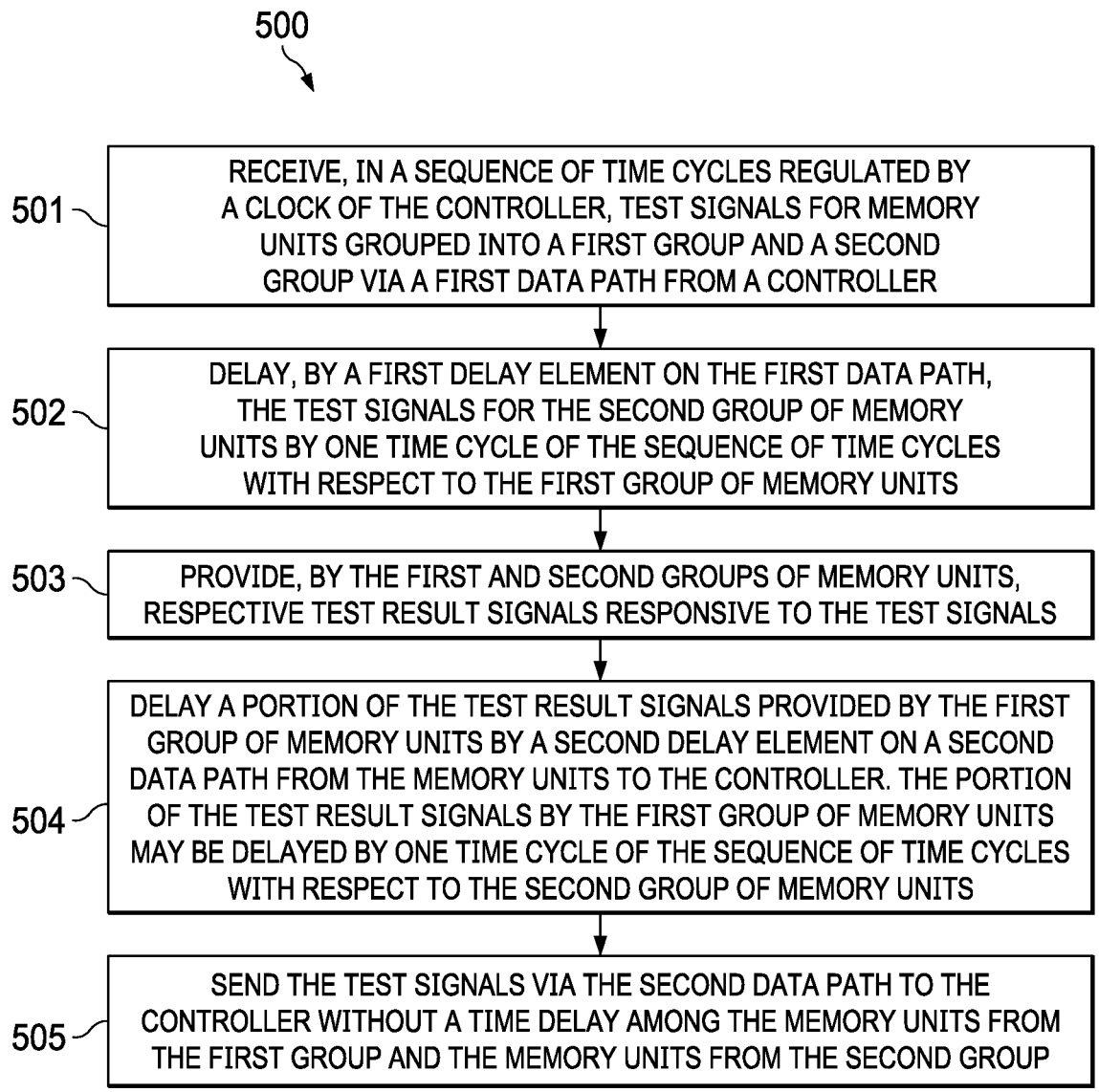
FIG. 5 is a flow diagram of a method for memory testing in an MDP architecture, in accordance with various examples.

FIG. 5 is a flow diagram of a method 500 for memory testing in an MDP architecture, in accordance with various examples. For example, the method 500 may be performed in the MDP architecture 199. At step 501, test signals for memory units grouped into a first group and a second group may be received via a first data path from a controller. The test signals may be received in a sequence of time cycles regulated by a clock of the controller. For example, the test signals 300 for the memory units 130 may be received from a BIST controller on the input channel 206 of the MDP architecture 199. At step 502, the test signals for the second group of memory units may be delayed, by a first delay element on the first data path, by one time cycle of the sequence of time cycles with respect to the first group of memory units. For example, the first delay element 215 may delay the test signals 300 by one time cycle of the clock signal 305 for the second group 224 with respect to the first group 223 of memory units 130. The non-delayed first test signals 301 and the delayed second test signals 302 may be sent to the memory units 130 of the first group 223 and the second group 224 through the first multiplexer 231 and the second multiplexer 232, respectively. At step 503, the first and second groups of memory units may provide respective test result signals responsive to the test signals. For example, the first comparators 241 may provide test result signals responsive to the first test signals 301 received by the memory units 130 in the first group 223. The second comparators 243 may provide test result signals responsive to the delayed second test signals 302 received by the memory units 130 in the second group 224.

At step 504, a portion of the test result signals provided by the first group of memory units may be delayed by a second delay element on a second data path from the memory units to the controller. The portion of the test result signals by the first group of memory units may be delayed by one time cycle of the sequence of time cycles with respect to the second group of memory units. For example, the second delay element 220 may delay the test result signals from the first comparators 241 by one time cycle with respect to the test result signals from the second comparators 243. At step 505, the test signals may be sent via the second data path to the controller without a time delay among the memory units from the first group and the memory units from the second group. For example, after delaying the test result signals by the second delay element 220, the test result signals from the first group 223 and the second group 224 may include test result signals without a time delay among the memory units 130 with respect to the clock signal 305. The test result signals may be sent from the third multiplexer 233 and the fourth multiplexer 234 to the BIST controller on the output channel 208.

The term "couple" appears throughout the specification. The term may cover connections, communications or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement.

Unless otherwise stated, "about," "approximately," or "substantially" preceding a value means+/−10 percent of the stated value. Modifications are possible in the described examples, and other examples are possible within the scope of the claims.

What is claimed is:

1. An apparatus, comprising:
   memory units arranged in parallel and coupled to a first data path and a second data path, the memory units grouped in a first group of memory units and a second group of memory units, wherein the first data path and the second data path are adapted to be coupled to a built-in self-test (BIST) controller;
   a first delay element disposed on the first data path and coupled to the second group of memory units, the first delay element having a first delay element output configured to send, from the BIST controller to the second group of memory units, signals for write and read operations in a sequence of time cycles delayed by a time cycle of the sequence of time cycles with respect to the first group of memory units; and
   a second delay element disposed on the second data path and coupled to the first group of memory units, the second delay element having a second delay element output configured to send, from the first group of memory units to the BIST controller, test result signals delayed by a time cycle of the sequence of time cycles, the delayed test result signals having a matching delay to the delayed write and read operations.

2. The apparatus of claim 1, comprising N memory units, wherein the first group of memory units comprises M memory units and the second group of memory units comprises N-M memory units, wherein M is less than N, and wherein N and M are integers.

3. The apparatus of claim 1, wherein the memory units comprise:
   read and write enabled memories arranged in parallel to each other, wherein the read and write enabled memories are grouped into a first group of read and write enabled memories and a second group of read and write enabled memories; and comparators arranged in parallel to each other and respectively coupled to the read and write enabled memories, wherein the comparators are grouped in a first group of comparators coupled to the first group of read and write enabled memories and a second group of comparators coupled to the second group of read and write enabled memories.

4. The apparatus of claim 3, wherein the first delay element has a first delay element second output configured to send from the BIST controller to the first group of memory units the signals for write and read operations in a second sequence of time cycles delayed by a time cycle of the second sequence of time cycles with respect to the second group of memory units.

5. The apparatus of claim 4, further comprising a third delay element disposed on the second data path and coupled to the second group of memory units, the third delay element having a third delay element output configured to send to the BIST controller from the second group of memory units the test result signals delayed by a time cycle of the second sequence of time cycles.

6. The apparatus of claim 5, further comprising:
a first multiplexer coupled to the first delay element and to the first group of read and write enabled memories, the first multiplexer having a first multiplexer first input configured to receive the delayed write and read operations from the first delay element and a first multiplexer second input configured to receive the signals for the write and read operations from an input channel from the BIST controller, and the first multiplexer further having a first multiplexer output configured to send the write and read operations or the delayed write and read operations to the first group of read and write enabled memories; and
a second multiplexer coupled to the first delay element and to the second group of read and write enabled memories, the second multiplexer having a second multiplexer first input configured to receive from the first delay element the delayed write and read operations and a second multiplexer second input configured to receive the signals for the write and read operations from the input channel from the BIST controller, and the second multiplexer further having a second multiplexer output configured to send the write and read operations or the delayed write and read operations to the second group of read and write enabled memories.

7. The apparatus of claim 6, further comprising:
a third multiplexer coupled to the first group of comparators and the third delay element, the third multiplexer having a third multiplexer first input configured to receive the test result signals from the first group of comparators and a third multiplexer second input configured to receive the delayed test result signals from the second delay element, and the third multiplexer further having a third multiplexer output configured to send the test result signals or the delayed test result signals to the BIST controller; and
a fourth multiplexer coupled to the second group of the comparators and the second delay element, the fourth multiplexer having a fourth multiplexer input configured to receive the test result signals from the second group of comparators and a fourth multiplexer second input configured to receive the delayed test result signals from the third delay element, and the fourth multiplexer further having a fourth multiplexer output configured to send the test result signals or the delayed test result signals to the BIST controller.

8. The apparatus of claim 7, wherein the first multiplexer and the fourth multiplexer are coupled to a first pipeline bypass channel configured to enable delaying the write and read operations to the second group of read and write enabled memories and delaying the test result signals from the first group of read and write enabled memories, and wherein the second multiplexer and the third multiplexer are coupled to a second pipeline bypass channel configured to enable delaying the write and read operations to the first group of read and write enabled memories and delaying the test result signals from the second group of read and write enabled memories.

9. The apparatus of claim 6, further comprising:
one or more fourth delay elements coupled in parallel with the first group of read and write enabled memories between the first multiplexer and the first group of comparators; and
one or more fifth delay elements coupled in parallel with the second group of read and write enabled memories between the second multiplexer and the second group of comparators.

10. The apparatus of claim 5, further comprising a clock channel coupled to the first delay element, the second delay element and the third delay element, each one of the first delay element, the second delay element and the third delay element having a respective delay element input configured to receive, from the clock channel, the sequence of time cycles or the second sequence of time cycles.

11. A method, comprising:
receiving, via a first data path from a controller, test signals for memory units, wherein the test signals are received in a sequence of time cycles regulated by a clock of the controller, and wherein the memory units are grouped into a first group of memory units and a second group of memory units;
delaying, by a first delay element on the first data path, the test signals for the second group of memory units by a time cycle of the sequence of time cycles with respect to the first group of memory units;
providing, by the memory units, respective test result signals responsive to the test signal;
delaying, by a second delay element on a second data path from the memory units to the controller, a portion of the test result signals provided by the first group of memory units by a time cycle of the sequence of time cycles with respect to the second group of memory units; and
sending, via the second data path to the controller, the test result signals without a time delay among the memory units, wherein the test result signals are sent to the controller without a lag between the test result signals from the first group of memory units and the test result signals from the second group of memory units relative to the clock of the controller.

12. The method of claim 11, wherein providing the test result signals responsive to the test signals comprises:
writing the test signals to the memory units during a time cycle of the sequence of time cycles;
reading, at a next time cycle of the sequence of time cycles, respective signals from the memory units; and
providing the test result signals indicating whether the read signals from the memory units match the test signals.

13. The method of claim 12, further comprising:
after writing the test signals to the memory units, delaying the test signals by a time cycle of the sequence of time cycles via one or more third delay elements in parallel with the memory units; and after reading the respective signals from the memory units, comparing the read signals with the delayed test signals to provide the test result signals.

14. The method of claim 11, further comprising:
receiving, via the first data path from the controller, new test signals at the memory units, wherein the new test signals are received in a new sequence of time cycles;
delaying, by the first delay element, the new test signals for the first group of memory units by a time cycle of the sequence of time cycles with respect to the second group of memory units;
providing, by the memory units, respective new test result signals responsive to the new test signals;
delaying, by a third delay element on the second data path, a portion of the new test result signals provided by the second group of memory units by a time cycle of the sequence of time cycles with respect to the first group of memory units; and
sending, via the second data path to the controller, the new test result signals without a time delay among the memory units.

15. The method of claim 14, wherein delaying the test signals by the first delay element and delaying the test result signals by the second delay element comprises sending a first enable pipeline bypass signal to the first data path and sending the first enable pipeline bypass signal to the second data path.

16. The method of claim 15, wherein delaying the new test signals by the first delay element and delaying the new test result signals by the third delay element comprises sending a second enable pipeline bypass signal to the first data path and sending the second enable pipeline bypass signal to the second data path.

17. The method of claim 11, further comprising:
receiving, from the controller via the first data path, new test signals in a new sequence of time cycles;
blocking, at the first delay element or the first data path, the new test signals for the first group of memory units;
providing, by the second group of memory units, respective new test result signals responsive to the new test signals; and
sending, via the second data path, the new test result signals from the second group of memory units to the controller.

18. A non-transient computer readable medium storing program instructions that, when executed by a processor, cause the processor to:
provide test signals in a sequence of time cycles to a first group of memory units;
delay the test signals with respect to the first group of memory units by a time cycle of the sequence of time cycles to form delayed test signals;
provide the delayed test signals to a second group of memory units;
perform write operations, at first time cycles of the sequence of time cycles, on the test signals to the first group of memory units and on the delayed test signals to the second group of memory units;
perform read operations, at second time cycles next to the first time cycles in the sequence of time cycles, to provide respective signals from the first group of memory units and the second group of memory units;
provide test result signals from the first group of memory units and the second group of memory units based on the test signals, the delayed test signals and the respective signals;
delay the test result signals from the first group of memory units by a time cycle of the sequence of time cycles with respect to the second group of memory units; and
provide, from the first group and the second group of memory units, the test result signals at same time cycles of the sequence of time cycles without a time delay among the memory units.

19. The non-transient computer readable medium of claim 18, wherein the program instructions causing the processor to provide the test result signals comprise instructions to:
responsive to performing the write operations, at the first time cycles of the sequence of time cycles, on the test signals to the first group of memory units and on the delayed test signals to the second group of memory units at each time cycle, hold the test signals and the delayed test signals for a time cycle of the sequence of time cycles; and
responsive to reading the respective signals, at the second time cycles next to the first time cycles in the sequence of time cycles, compare the respective signals with the held test signals and delayed test signals by the time cycle of the sequence of time cycles to set the test result signals accordingly, wherein the test result signals indicate whether the respective signals match the held test signals and delayed test signals.

20. The non-transient computer readable medium of claim 18, wherein a power for processing the test signals is less than or equal to a sum of a first power for writing the test signals to the first group of memory units and a second power for reading the test result signals from the second group of memory units.

* * * * *